United States Patent [19]

Rankin

[11] 3,859,604

[45] Jan. 7, 1975

[54] ISOLATED AMPLIFIER

[76] Inventor: John Charles Rankin, 908 S. Hobart Blvd., Los Angeles, Calif. 90006

[22] Filed: July 26, 1972

[21] Appl. No.: 275,438

[52] U.S. Cl. .................................... 330/10, 330/22
[51] Int. Cl. ............................................ H03f 3/38
[58] Field of Search ........... 330/10, 22, 21, 31, 200; 332/31 T, 37 R, 37 D; 331/117

[56] References Cited

UNITED STATES PATENTS

| | | | |
|---|---|---|---|
| 2,987,682 | 6/1961 | Adams et al. | 332/31 T |
| 2,991,357 | 7/1961 | True | 332/31 T X |
| 3,648,188 | 3/1972 | Ratcliff | 330/31 X |
| 3,656,065 | 4/1972 | Reinhard et al. | 330/10 |

FOREIGN PATENTS OR APPLICATIONS

| | | | |
|---|---|---|---|
| 254,921 | 7/1963 | Australia | 330/21 |
| 1,063,646 | 8/1959 | Germany | 330/10 |

*Primary Examiner*—James B. Mullins

[57] ABSTRACT

An audio amplifier in which the input section has means for modulating a radio frequency carrier so that isolation provided by radio frequency coupling allows the output section to obtain power from a power line without a power transformer.

2 Claims, 3 Drawing Figures

ISOLATED AMPLIFIER

This invention relates to transistor and vacuum tube amplifiers and more particularily to those used for high fidelity sound. With the demand for high power output from amplifiers, the power transformer has become a large and expensive item and previous attempts to eliminate the power transformer have resulted in distortion, hum and danger to the operator.

It is an object of this invention to reduce the power transformer to a small fraction of the usual size with a consequent decrease in cost and weight without introducing distortion, hum or danger to the operator.

The amplifier described herein enables transistors or vacuum tubes which are used in the output stages and consume the major portion of the power, to operate from the power line without a power transformer.

In accordance with the invention, the audio frequency signal to be amplified is used to modulate a radio frequency carrier. The modulated carrier is coupled by a radio frequency transformer or two radio frequency capacitors, to the main amplifier section where it is detected and the recovered signal is used for further amplification. The main amplifier receives power from rectifiers connected directly to the power line. There is no shock hazard to operators handling the input section, which receives power through a small power transformer, because the radio frequency transformer or radio frequency coupling capacitors will not pass the low frequency power line voltage.

Figure 1:
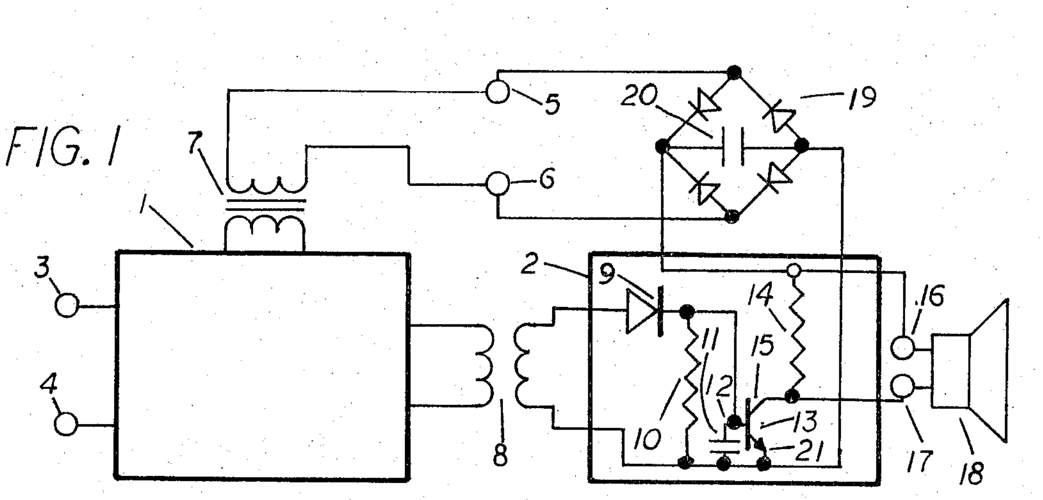
FIG. 1 is a schematic drawing of the invention. This version uses a radio frequency transformer to isolate the input and output sections of the amplifier.

Referring now more particularily to FIG. 1 which shows an audio amplifier divided into two parts, the input section 1 and the output section 2. The signal to be amplified is connected to the input section 1 at terminals 3 and 4. The input section contains a radio frequency oscillator and a means for modulating the radio frequency carrier. The input section 1 obtains power from the line terminals 5 and 6 through a power transformer 7. The radio frequency carrier generated in the input section 1 is modulated by the signal applied at terminals 3 and 4. The modulated carrier is coupled from the input section 1 to the output section 2 by means of a radio frequency transformer 8. The output section 2 contains a detector 9, a load resistor 10 and a bypass capacitor 11 so that the detected signal is applied to the base 12 of transistor 13. An audio frequency signal is developed across the load resistor 14 connected to the collector 15 and this signal appears at the output terminals 16 and 17 which may be connected to a loudspeaker 18 as shown or other device. Power for transistor 13 is obtained from bridge rectifier 19 and filtered by capacitor 20. The positive of the power supply is connected to one end of resistor 14 and the negative of the power supply connected to the emitter 21 of the transistor 13. No power transformer is necessary between the power line terminals 5 and 6 and the bridge rectifier 19 because isolation for the input terminals 3 and 4 and all of the input section is provided by the power transformer 7 and the radio frequency transformer 8. Because the power transformer 7 does not have to handle the power for the output section it can be very small in size and cost. The output section 2 is shown to contain only one transistor 13 for clarity but in practice it would normally contain more than one transistor and possibly two output transistors or vacuum tubes in pushpull to conform to standard amplifier practice. Also in some instances it may be preferable to multiply or reduce the direct current supply for the output section 2 without using a transformer but using diode multipliers or SCR and Triac circuits.

Figure 2:
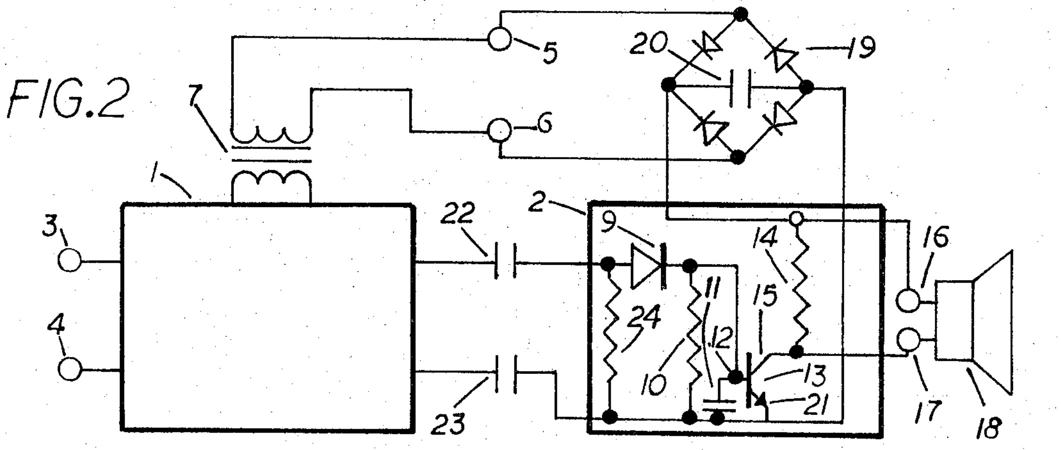
FIG. 2 is a schematic drawing of the invention using two radio frequency capacitors to isolate the input and output sections of the amplifier.

Referring now to FIG. 2, the operation of this amplifier is similar to that of the amplifier of FIG. 1 except that the modulated carrier is transferred from the input section 1 to the output section 2 by means of the two radio frequency coupling capacitors 22 and 23 in place of the radio frequency transformer 8 of FIG. 1 and also, a resistor 24 in FIG. 2 provides a return path for detector 9 which was provided by the transformer 8 in FIG. 1. The capacitors 22 and 23 provide isolation between the input section 1 and the output section 2 and the value of the capacitors may be between two and five hundred pico-farads, even with the larger value the impedance to a sixty hertz line voltage is in the vicinity of five megohms which presents no shock hazard and will not introduce hum signals. If the capacitors 22 and 23 were large enough to pass audio frequency signals distortion from hum and a shock hazard would result.

Although FIG. 1 and FIG. 2 show the isolating elements consisting of the radio frequency transformer 8 and the radio frequency coupling capacitors, 22 and 23, external to both the input section 1 and the output section 2, the radio frequency transformer 8 and the radio frequency coupling capacitors 22 and 23 may be contained in either the input section 1 or the output section 2, the physical position of any component is of no importance.

Figure 3:
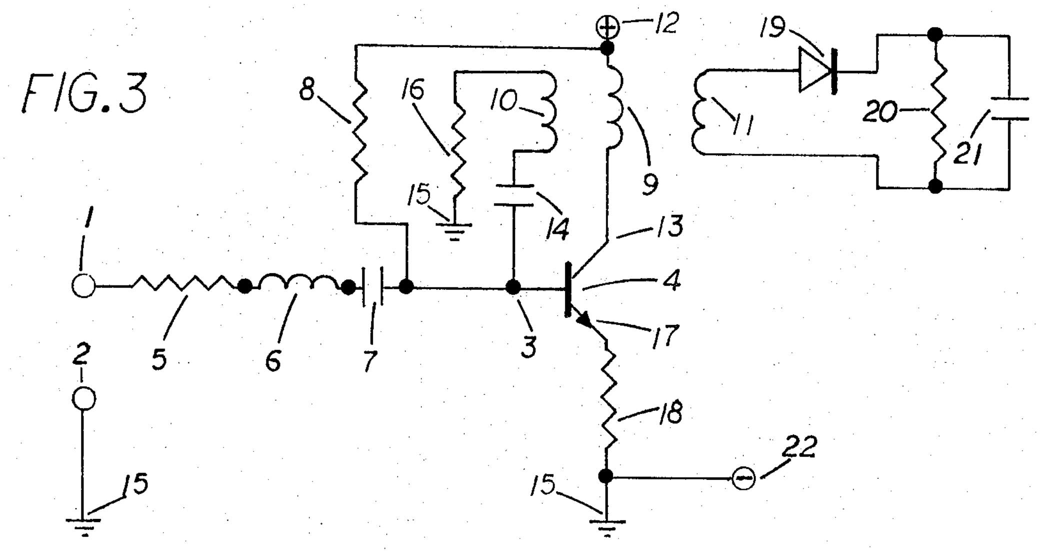
FIG. 3 is a schematic of a modulated oscillator which can be used with the invention.

Referring now to FIG. 3 which shows one method of producing, modulating and detecting a carrier with very little detected distortion. An audio frequency signal to be amplified is applied to terminals 1 and 2 so that the audio frequency signal is applied to the base 3 of transistor 4, through resistor 5, inductance 6 and capacitor 7. Forward bias for the base 3 is provided by resistor 8. Resistor 5 decreases distortion by assuring that the base 3 is supplied with an audio signal from a current source. The inductance 6 prevents radio frequency voltage from the base 3 from appearing at terminal 1. The capacitor 7 prevents the direct current forward bias on the base 3 from appearing at terminal 1. Windings 9, 10 and 11 form a radio frequency transformer, winding 9 is the primary winding connected to the positive supply terminal 12 and the collector 13 of transistor 4. Winding 10 is the feedback winding connected to make the circuit oscillate, it is connected to the radio frequency feedback capacitor 14 and to ground 15 through resistor 16. The emitter 17 is connected to ground 15 through resistor 18, this resistor provides negative feedback and reduces distortion. Winding 11 is the output winding and is shown connected to a detector diode 19, a load resistor 20 and a bypass capacitor 21. The negative supply terminal 22 is shown connected to the ground 15.

When an audio frequency signal is applied between the input terminals 1 and 2 the signal modulates the carrier produced by oscillator transistor 4 and the audio frequency signal is recovered across the load resistor 20 so that the input signal across terminals 1 and 2 is electrically isolated from the load resistor 20.

If the modulated oscillator of FIG. 3 were used in FIG. 1, terminals 3 and 4 of FIG. 1 would correspond to terminals 1 and 2 of FIG. 3, also, the transformer 8 of FIG. 1 would correspond to windings 9 and 11 of FIG. 3.

If the modulated oscillator of FIG. 3 were used in FIG. 2, terminals 3 and 4 of FIG. 2 would correspond to terminals 1 and 2 of FIG. 3, also, capacitor 22 of FIG. 2 would be connected to the collector 13 and capacitor 23 of FIG. 2 would be connected to the positive supply terminal 12. The winding 11 would not be necessary although it would be possible to connect capacitors 19 and 20 to this winding instead of winding 9.

As previously mentioned, resistors 5 and 18 are used to reduce distortion, the action of resistor 5 is often obtained automatically from a preceding amplifier stage collector load resistor or other source impedance which assures that the base 3 is driven from a current source. However, in the case of a modulated oscillator, it is possible to further reduce distortion by assuring that the radio frequency feedback applied to the base 3 is from a current source. This is the purpose of resistor 16. With the use of resistor 16, the modulated oscillator and detector has produced an audio frequency voltage, across load resistor 20, with total harmonic distortion of less than 0.2%. Without the resistor 16 it is difficult to reduce distortion below 2.0%. Because the radio frequency feedback voltage requirements are different from the audio frequency voltage requirements at the base 3 of transistor 4, it is not usually possible to combine resistor 5 and resistor 16, resistor 5 often being many times the value of resistor 16 which is usually between one hundred and one thousand ohms. In the schematic of FIG. 3 the low distortion was obtained with resistor 16 five hundred and sixty ohms with a certain type of transistor. This value is not critical and may be varied one hundred ohms in either direction.

If capacitor 14 is reduced in value, to produce a higher source impedance, similar to that produced by the addition of resistor 16, an undesired phase change is produced, the oscillator has a tendency to stop oscillating and it is not possible to obtain the low distortion produced by the addition of resistor 16.

If an inductance is added in series with capacitor 14 to increase the source impedance, similar to that produced by the addition of resistor 16, an undesired phase shift is produced, the oscillator has a tendency to produce parasitic oscillations, draw excessive current and it is not possible to obtain the low distortion produced by the addition of resistor 16.

While FIG. 3 shows one method of modulating a carrier it is possible to use an oscillator connected to a modulated radio frequency amplifier stage and achieve similar results.

It is believed that no further explanation is required and it is desired to point out that the invention may be varied in many ways without affecting the advantages described. It is desired to be limited only by the language of the claims interpreted as broadly as justified commensurate with the prior art.

What I claim and desire to secure Letters Patent of the United States is:

1. A transistor audio frequency amplifier with two power supplies in which the audio frequency signal to be amplified is used to modulate a radio frequency oscillator the signal being transferred from the first part of the amplifier to the second part of the amplifier by a radio frequency transformer where said audio frequency signal is recovered by demodulation and amplified with said radio frequency transformer providing isolation between the first part of the amplifier which receives power from a line operated transformer type supply and the second part of the amplifier which obtains direct current power for the output transistors from a line operated transformerless power supply.

2. A transistor audio frequency amplifier with two power supplies in which the audio frequency signal to be amplified is used to modulate a radio frequency oscillator the signal being transferred from the first part of the amplifier to the second part of the amplifier by two radio frequency coupling capacitors where said audio frequency signal is recovered by demodulation and amplified with said two radio frequency coupling capacitors providing isolation between the first part of the amplifier which receives power from a line operated transformer type supply and the second part of the amplifier which obtains direct current power for the output transistors from a line operated transformerless supply.

* * * * *